US008760161B2

(12) United States Patent
Subramanian et al.

(10) Patent No.: US 8,760,161 B2
(45) Date of Patent: Jun. 24, 2014

(54) SYSTEM AND METHOD FOR ENHANCED CONTRAST MR IMAGING

(75) Inventors: Raman Krishnan Subramanian, Waukesha, WI (US); Reed F. Busse, Madison, WI (US)

(73) Assignee: General Electric Company, Schenectady, NY (US)

( * ) Notice: Subject to any disclaimer, the term of this patent is extended or adjusted under 35 U.S.C. 154(b) by 554 days.

(21) Appl. No.: 13/031,354

(22) Filed: Feb. 21, 2011

(65) Prior Publication Data

US 2012/0212222 A1  Aug. 23, 2012

(51) Int. Cl.
*G01V 3/00* (2006.01)
(52) U.S. Cl.
USPC .......................................... 324/309
(58) Field of Classification Search
USPC .................................. 324/300–322
See application file for complete search history.

(56) References Cited

U.S. PATENT DOCUMENTS

| | | | | |
|---|---|---|---|---|
| 4,748,409 A | * | 5/1988 | Frahm et al. | 324/309 |
| 5,499,629 A | * | 3/1996 | Kerr et al. | 600/410 |
| 5,583,950 A | * | 12/1996 | Prokoski | 382/212 |
| 6,064,203 A | * | 5/2000 | Bottomley | 324/309 |
| 6,307,368 B1 | * | 10/2001 | Vasanawala et al. | 324/309 |
| 6,566,873 B1 | * | 5/2003 | Smith et al. | 324/300 |
| 6,801,800 B2 | | 10/2004 | Miyazaki et al. | |
| 6,914,428 B2 | * | 7/2005 | Dixon et al. | 324/307 |
| 7,109,705 B2 | * | 9/2006 | Smith et al. | 324/300 |
| 7,323,871 B2 | * | 1/2008 | Foo | 324/307 |
| 7,541,809 B2 | * | 6/2009 | Miyoshi | 324/309 |
| 7,616,835 B2 | * | 11/2009 | Lobregt | 382/294 |
| 7,782,056 B2 | * | 8/2010 | Noterdaeme et al. | 324/309 |
| 8,077,955 B2 | * | 12/2011 | Dannels et al. | 382/131 |
| 8,089,278 B1 | * | 1/2012 | Du | 324/307 |
| 8,502,538 B2 | * | 8/2013 | Dannels et al. | 324/318 |

FOREIGN PATENT DOCUMENTS

JP  2009050605 A  *  3/2009

OTHER PUBLICATIONS

Busse, "Flow Sensitivity of CPMG Sequences with Variable Flip Refocusing and Implications for CSF Signal Uniformity in 3D-FSE Imaging," Proc. Intl. Soc. Mag. Reson. Med., vol. 14, 2006, p. 2430.
Miyazaki et al., "Peripheral MR Angiography: Separation of Arteries from Veins with Flow-spoiled Gradient Pulses in Electrocardiography-triggered Three-dimensional Half-Fourier Fast Spin-Echo Imaging," Radiology, vol. 227, No. 3, Jun. 2003, pp. 890-896.

* cited by examiner

*Primary Examiner* — Dixomara Vargas
(74) *Attorney, Agent, or Firm* — Ziolkowski Patent Solutions Group, SC

(57) ABSTRACT

A system and method for enhanced contrast MR imaging include a computer programmed to perform a first scan of an imaging object based on a first fast spin echo (FSE) scan sequence comprising a first series of RF pulses having a first flip angle sequence to acquire a first MR data set and perform a second scan of the imaging object based on a second FSE scan sequence comprising a second series of RF pulses having a second flip angle sequence, wherein the second flip angle sequence is different from the first flip angle sequence to acquire a second MR data set. The computer is further programmed to generate a difference image based on the first and second MR data sets.

23 Claims, 4 Drawing Sheets

SYSTEM AND METHOD FOR ENHANCED CONTRAST MR IMAGING

BACKGROUND OF THE INVENTION

Embodiments of the invention relate generally to MR imaging and, more particularly, to a system and method for enhanced contrast MR imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

One area of MR imaging that assists in the creation of high-contrast images is magnetic resonance angiography (MRA). Flow difference peripheral MRA technique is based on physiological flow difference between systole and diastole. This technique relies on the arterial flow difference between the cardiac diastole and systole and acquires images at each of these two cardiac phases. In general, faster arterial flow during systole results in nearly void arterial signal on the systole images while slower arterial flow during diastole results in brighter arterial signal. Since the venous and background signals are relatively independent of the cardiac cycle, a subtraction of the systole images from the diastole images results in arterial only images with good background and venous suppression However, although the subtracted images depict the systolic faster flowing arteries, arteries that do not exhibit enough of a flow difference between the systole and diastole phases are likely to be subtracted out in a final flow difference image. Thus, for MRA, the potential diagnostic usage of this technique has hitherto been beneficial to arteries which flow slower during diastole and which flow faster during systole.

It has been demonstrated that changing the readout gradient crushers between the two acquisitions can enhance the visualization of the hither-to-slow flowing arteries during systole. This technique, which may be referred as the readout spoiler technique, increases the readout spoiler gradient during systolic acquisition such that even if the flow is slower, such arteries will be dephased, resulting in darker systolic arterial signal. However, for the diastolic acquisition, lesser readout spoiler (or flow compensation) will be used to retain the arterial signal. Although such a schema of modifying the readout spoilers between the two acquisitions benefits in the visualization of slower flowing arteries, it may also result in 1) an increased blurring due to longer echo spacing (i.e., since the spoiler gradient amplitudes need to modified in real-time in between the acquisitions of each of the images), 2) an enhanced background signal on the subtracted image since the eddy currents during the two acquisitions will be different, and 3) the presence of fine line artifacts due to uncrushed free induction decay signal between the refocus pulses since the readout crushers are different between the two acquisitions.

It would therefore be desirable to have a system and method capable of enhancing the visualization of arteries exhibiting a reduced flow difference between the systole and diastole phases while reducing artifacts such as blurring and fine lines. It would also be desirable to enhance the visualization of any tissue that experiences faster signal decay than another tissue.

BRIEF DESCRIPTION OF THE INVENTION

Therefore, in accordance with one aspect of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus further includes a computer programmed to perform a first scan of an imaging object based on a first fast spin echo (FSE) scan sequence comprising a first series of RF pulses having a first flip angle sequence to acquire a first MR data set and perform a second scan of the imaging object based on a second FSE scan sequence comprising a second series of RF pulses having a second flip angle sequence, wherein the second flip angle sequence is different from the first flip angle sequence to acquire a second MR data set. The computer is further programmed to generate a difference image based on the first and second MR data sets.

In accordance with another aspect of the invention, a method of magnetic resonance (MR) imaging includes scanning an imaging object based on a first fast spin echo (FSE) scan sequence and reconstructing a first image from the first MR data set. The first FSE scan sequence includes a first series of RF pulses having a first flip angle pattern to acquire a first MR data set. The method also includes scanning the imaging object based on a second FSE scan sequence and reconstructing a second image from the second MR data set. The second FSE scan sequence includes a second series of RF pulses having a second flip angle pattern to acquire a second MR data set, wherein the second flip angle pattern is different from the first flip angle pattern. The method further includes creating a difference image based on the first and second images.

In accordance with yet another aspect of the invention, a non-transitory computer readable medium having thereon a computer program comprising instructions, which, when executed by a computer, cause the computer to prescribe a first fast spin echo (FSE) scan sequence including a first series of RF pulses having a first flip angle sequence and to scan an imaging object based on the first FSE scan sequence to acquire a first MR data set. The instructions also cause the computer to prescribe a second FSE scan sequence including a second series of RF pulses having a second flip angle sequence and to scan the imaging object based on the second FSE scan sequence to acquire a second MR data set. The second flip angle sequence is different from the first flip angle sequence. In addition, the instructions cause the computer to reconstruct a first image and a second image based on the first and second MR data sets, respectively and to create a difference image based on the first and second images.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A system and method are provided that perform multiple MR image scans to acquire data where the flip angles for at least some of the refocusing pulses of the RF pulse sequence for a first MR image scan are distinct from the corresponding refocusing pulses of the RF pulse sequence for a second MR image scan. First and second MR images are reconstructed based on the first and second MR image scans, and a single image is created based on the first and second MR images that have a high contrast while having reduced artifacts.

Figure 1:
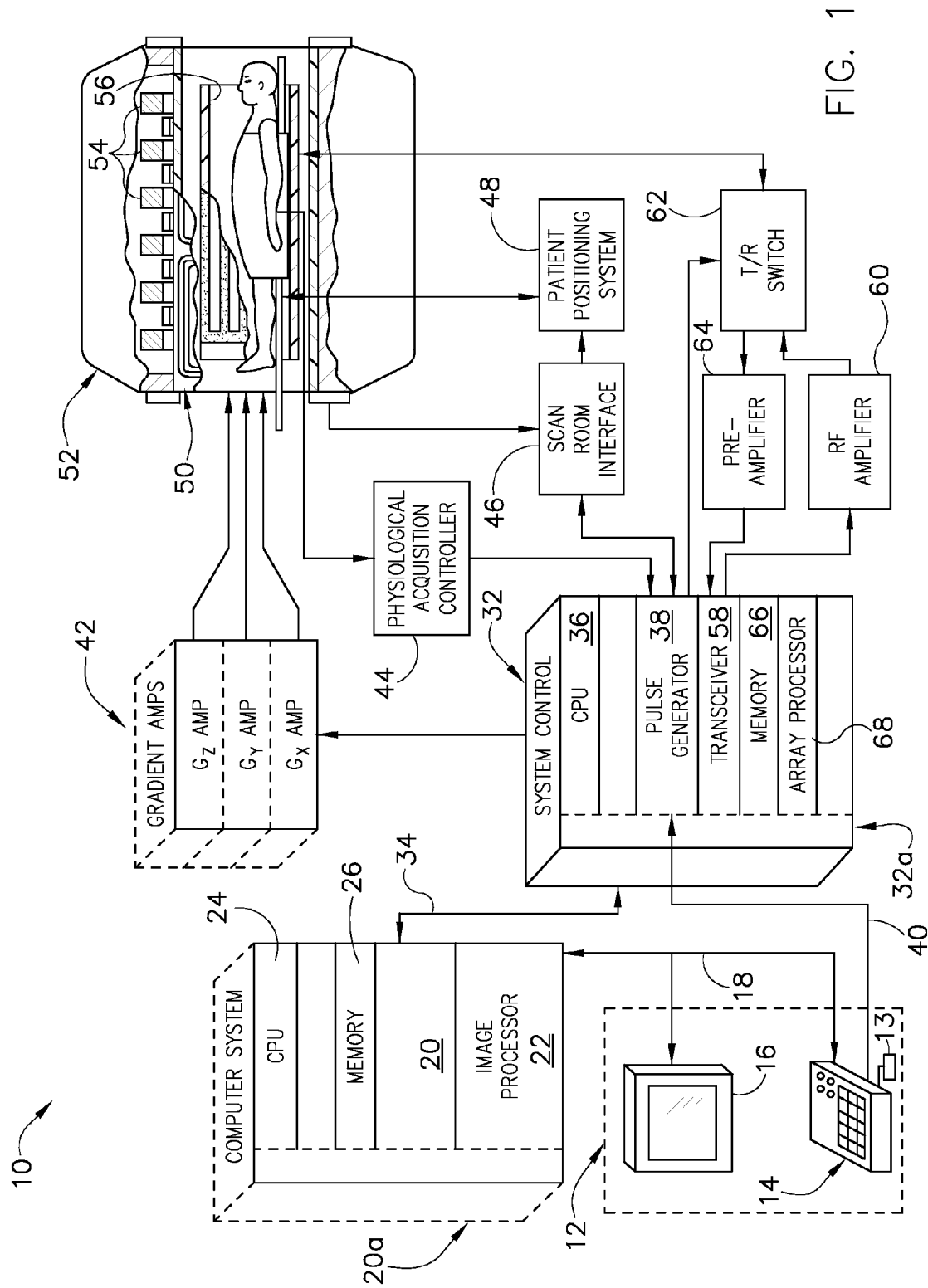
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
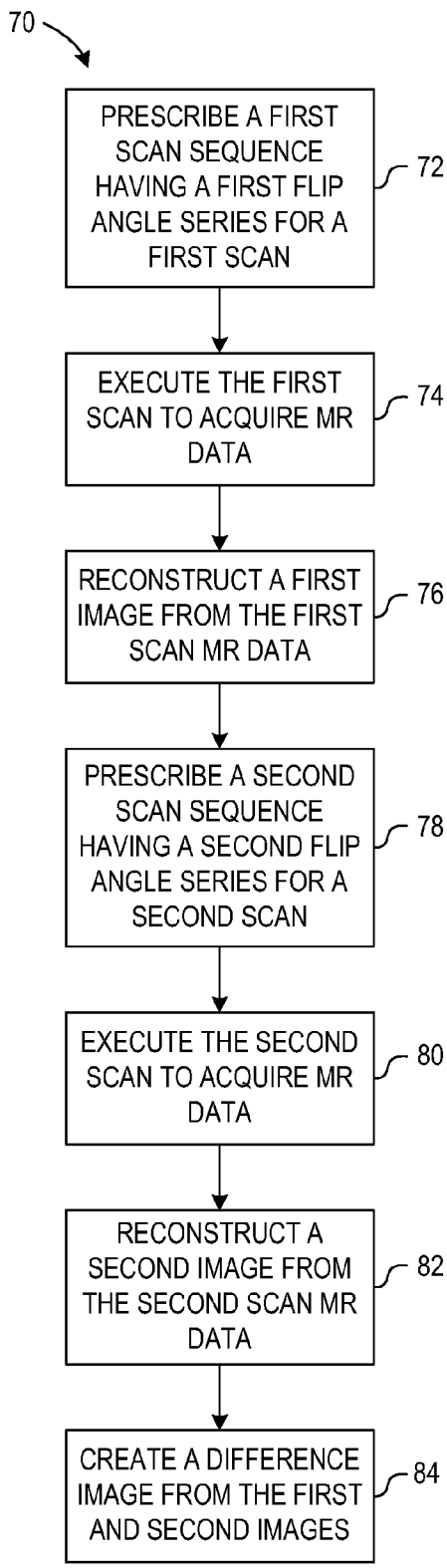
FIG. 2 is a flowchart of a high-contrast MR imaging technique according to an embodiment of the invention.

FIG. 2 shows a technique 70 for creating a high-contrast MR image according to an embodiment of the invention. In an embodiment of the invention, computer system 20 may be programmed to perform technique 70. Technique 70 begins with prescribing a first scan sequence for a first scan at block 72. The first scan sequence is prescribed according to a fast spin echo (FSE) imaging sequence having an initial RF excitation pulse followed by a train of RF refocusing pulses. The FSE sequence may correspond to either a 2D or 3D imaging sequence. According to an embodiment of the invention, the flip angle for the initial RF excitation pulse may be set to 90 degrees, and the flip angles for the RF refocusing pulses of the pulse train may be set to 180 degrees. This embodiment, however, is merely an example, and other flip angles for the respective RF excitation and refocusing pulses may be used. In an embodiment, the flip angle to which the RF refocusing pulses is set to is substantially similar for each of the RF refocusing pulses.

At block 74, a first scan is executed according to the prescribed first scan sequence, and a first set of MR data is acquired from one or more objects within an imaging region-of-interest (ROI). Based on the first set of acquired MR data, a first image is reconstructed at block 76. In one embodiment, the first image is reconstructed using known reconstruction techniques for reconstructing images based on FSE-acquired imaging data.

Technique 70 continues at block 78 by prescribing a second scan sequence for a second scan. The second scan sequence is also prescribed according to a 2D or 3D FSE imaging sequence that has an initial RF excitation pulse followed by a train of RF refocusing pulses. According to an embodiment of the invention, the flip angle for the initial RF excitation pulse may be set to 90 degrees, but in contrast to the first scan sequence described above, at least some of the flip angles corresponding to a first quantity or plurality of the RF refocusing pulses of the second pulse train are set to an angle much less than 180 degrees. In this manner, the flip angle series of the second pulse train is different from the flip angle series of the first pulse train. That is, the pattern or sequence of the flip angle series of the second pulse train is different from the pattern or sequence of the flip angle series of the first pulse train. According to an embodiment of the invention, the flip angle of the first quantity of the RF refocusing pulses may be set to an angle in the range of 70 degrees to 150 degrees. For example, a first quantity of the RF refocusing pulses of the second pulse train may be set to an angle of 90 degrees or 106 degrees. This embodiment, however, is merely an example, and other flip angles for the respective RF excitation and refocusing pulses may be used. While the first quantity of RF refocusing pulses may each have a flip angle set to a substantially similar angle, it is contemplated that each RF refocusing pulse may have a flip angle that is similar to or distinct from the flip angles of the other RF refocusing pulses in the first quantity of RF refocusing pulses. The flip angle series for the first and second scans may be calculated or acquired from a database prior to or during the scan prescription. Furthermore, a user or operator may input a modification to the flip angle to which the first quantity of the RF refocusing pulses of the second pulse train may be set according to an embodiment of the invention. For example, a computer may be programmed to receive a user input during scan prescription that instructs the computer to set or modify one or more of the flip angles to a user-designated angle.

According to an embodiment of the invention, the first quantity of RF refocusing pulses having a flip angle of less than 180 degrees corresponds to the number of RF refocusing pulses prescribed to occur prior to or through the acquisition of MR data from the center of k-space, which may occur at the echo time TE. According to another embodiment of the invention, the first quantity of RF refocusing pulses having a flip angle of less than 180 degrees matches the number of the RF refocusing pulses of the first pulse train occurring prior to or through the acquisition of MR data from the center of k-space. A second quantity of RF refocusing pulses corresponding to the pulses occurring after the first quantity have flip angles set substantially to 180 degrees according to this embodiment. Setting the flip angle to 180 degrees for the second quantity of RF refocusing pulses helps to reduce signal enhancement from the background data.

At block 80, a second scan is executed according to the prescribed second scan sequence, and a second set of MR data is acquired from the one or more objects within the ROI. Based on the second set of acquired MR data, a second image is reconstructed at block 82. In one embodiment, the second image is reconstructed using known reconstruction techniques for reconstructing images based on FSE-acquired imaging data.

The first image reconstructed at block 76 will be different from the second image reconstructed at block 82. For example, for tissues that experience a slow signal decay or that experience less signal spoiling due to the second scan sequence, the difference between the image data based on these tissues will not be great. However, for tissues that experience a fast signal decay or that experience greater signal spoiling due to the second scan sequence, the difference between the image data based on these tissues will be great. At block 84, a difference image is created based on a subtraction of the second image data from the first image data. In this manner, the creation of the difference image is performed in the image domain. This difference image results in an image highlighting the tissue experiencing a fast signal decay or that experience greater signal spoiling due to the second scan sequence. That is, much of the image data corresponding to the slower tissue decay tissue will be attenuated in the difference image, and the tissue that experiences a fast tissue decay will have a high contrast and be highlighted in the difference image.

Embodiments of the invention contemplate that the steps of technique 70 illustrated in FIG. 2 may be performed in a different order from that shown. For example, in one embodiment, the first and second scan sequences may be prescribed prior to executing the first and second scans. Similarly, the execution of the second scan or the reconstruction of the second image may be performed prior to reconstruction of the first image.

Embodiments of the invention may be used to create high contrast difference images for stationary or flowing objects of interest. For example, a tissue such as a tumor that has a faster signal decay than surrounding tissue may be emphasized in a difference image based on embodiments of the invention.

In addition, high contrast flow difference images of blood, for example, may be useful in showing the arterial structure of a patient. For example, in an arterial flow study, unwanted signal enhancements can be minimized by reducing the systolic refocus flip train only during the earlier part of the echo train and using the maximum refocus train for the rest of the train to allow for lesser venous data and lesser background data. Flowing blood generally exhibits a faster signal decay during the systolic cardiac phase than during the diastolic cardiac phase, and stationary tissue that is not flowing or that flows much slower has a generally similar signal decay between the systolic and diastolic phases.

Accordingly, to create an image emphasizing the arterial structure while minimizing other structures, an embodiment of the invention may include imaging a patient using the first prescribed scan sequence as described above to create an image of maximum signal from all of the tissues in the ROI. The patient may then be imaged using the second prescribed scan sequence to obtain an image where the flowing blood in the arteries is spoiled as described above to minimize the flowing blood in the second image while including much of the signals from the remaining tissues. Then, creating a difference image using that described herein will result in an image where much of the image data from the stationary or non-moving tissues and from background data will be reduced or eliminated while leaving much of the image data from the blood flowing in the arteries.

Figure 3:
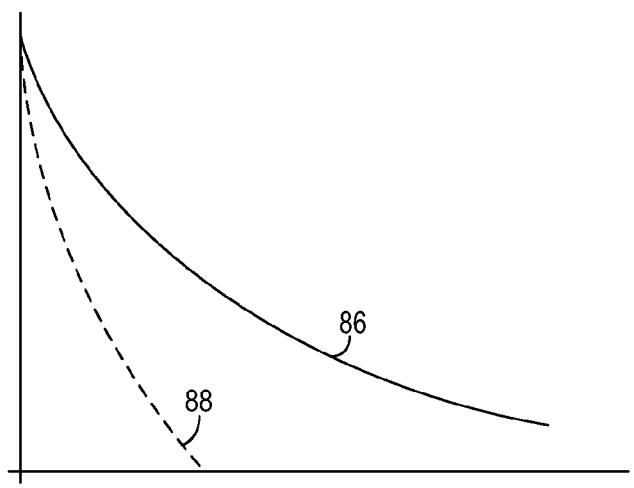
FIG. 3 is a schematic diagram showing contributions of first and second tissues to an image reconstructed according to an embodiment of the invention.
Figure 4:
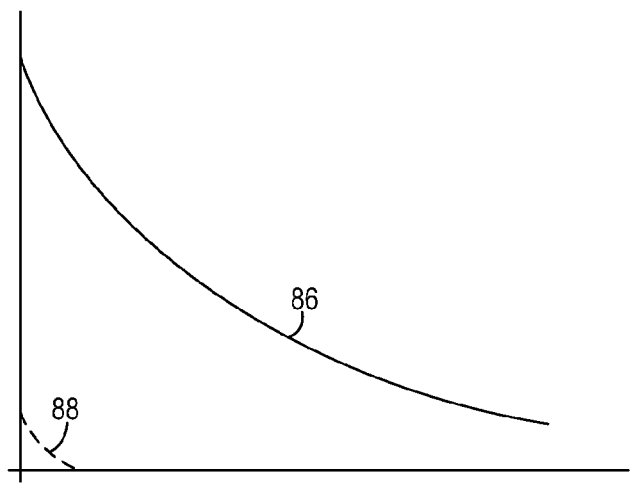
FIG. 4 is a schematic diagram showing contributions of the first and second tissues to another image reconstructed according to an embodiment of the invention.

FIG. 3 illustrates a schematic diagram of the contributions of a first tissue 86 and a second tissue 88 to an image reconstructed according to that described above with respect to the first image (steps 72-76). FIG. 4 illustrates a schematic diagram of the contributions of first tissue 86 and second tissue 88 to an image reconstructed according to that described above with respect to the second image (steps 78-82). As shown, there is some attenuation of the image data of first tissue 86 in the second image (FIG. 4) as compared with that of the first image (FIG. 3); however, the attenuation is slight, and much of the signal of first tissue 86 that is present in the first image is present in the second image.

In contrast, however, there is a much greater attenuation of the image data of second tissue 88 in the second image (FIG. 4) as compared with that of the first image (FIG. 3). That is, acquisition of signals from second tissue 88 based on the second scan sequence described above causes acquisition of signals from second tissue 88 to be greatly attenuated as compared with the signals acquired using the first scan sequence described above. Accordingly, FIG. 4 illustrates that there is very little contribution from second tissue 88 to the second image.

Figure 5:
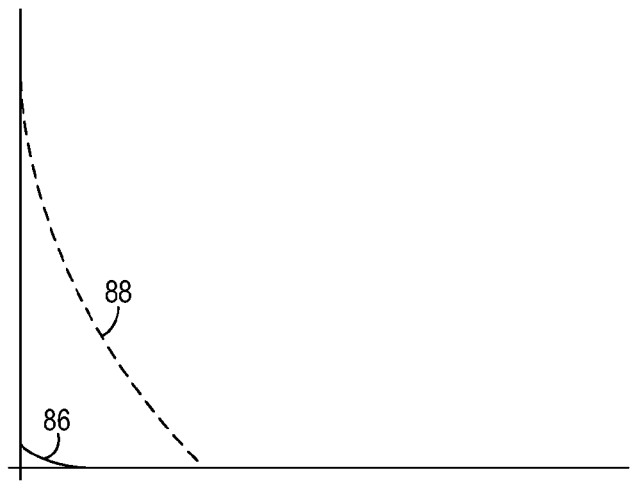
FIG. 5 is a schematic diagram showing contributions of the first and second tissues to a difference image based on FIGS. 3 and 4 according to an embodiment of the invention.

FIG. 5 shows a schematic diagram of a difference image according to an embodiment of the invention. FIG. 5 may be created according to step 84 of technique 70 by subtracting the image data from the second image illustrated in FIG. 4 from the first image illustrated in FIG. 3. As shown, the contribution of first tissue 86 to the difference image data has been greatly attenuated as compared with that of first and second images shown in FIGS. 3 and 4. The contribution of second tissue 88 to the difference image data is much larger than the attenuated first tissue data, resulting in a final image where the image data of second tissue 88 is highlighted and has a high contrast from the image data of first tissue 86.

Figure 6:
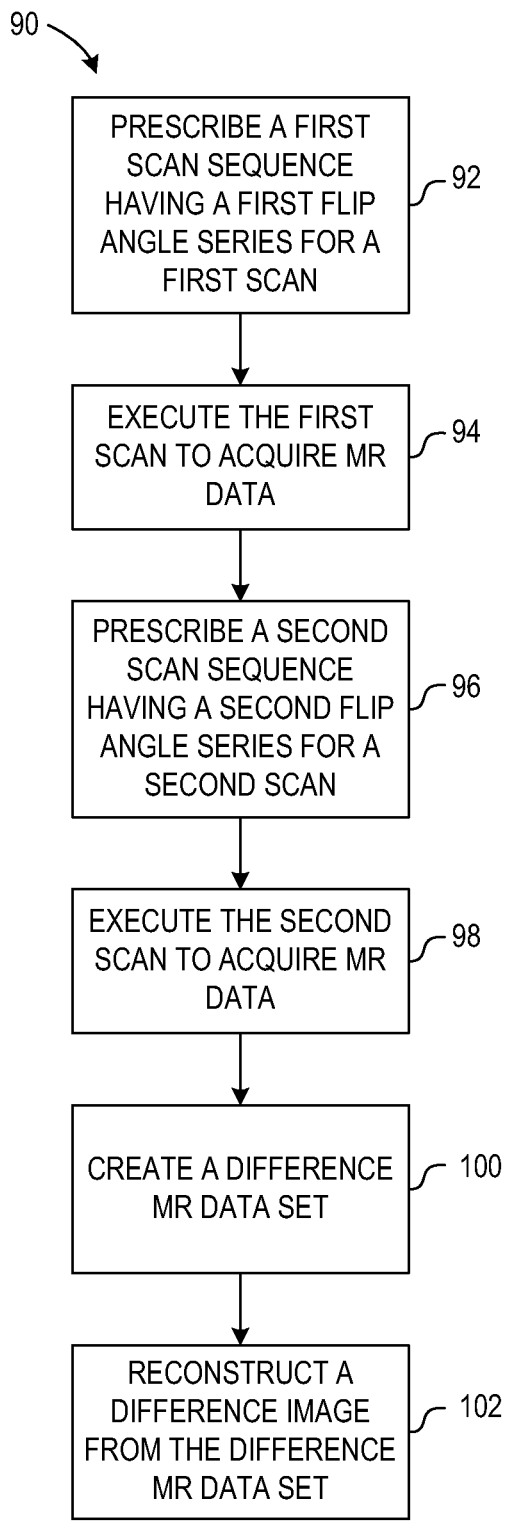
FIG. 6. shows a technique for creating a high-contrast MR image based on a subtraction in the complex domain according to an embodiment of the invention.

In an alternate embodiment of the invention, a difference image may be created based on a subtraction in the complex domain. For example. FIG. 6 shows a technique 90 for creating a high-contrast MR image based on a subtraction in the complex domain according to an embodiment of the invention. Similar to technique 70 as described above, technique 90 begins with prescribing a first scan sequence for a first scan at block 92. At block 94, a first scan is executed according to the prescribed first scan sequence, and a first set of MR data is acquired from one or more objects within an imaging region-of-interest (ROI).

Also, similar to technique 70, technique 90 continues at block 96 by prescribing a second scan sequence for a second scan, and at block 98, a second scan is executed according to the prescribed second scan sequence, and a second set of MR data is acquired from the one or more objects within the ROI.

At block 100, a difference MR data set is created by subtracting the second set of MR data from the first set of MR data in the complex domain. A difference image is then reconstructed from the difference MR data set at block 102.

It is further contemplated that, instead of acquiring a complete first MR data set followed by acquiring a complete second MR data set as described above with respect to technique 70 or technique 90, MR data for the first and second MR data sets may be alternately acquired in an interleaved manner. For example, a first shot may be executed to acquire a portion (e.g., such as a line) of MR data for the first MR data set followed by the execution of a second shot to acquire a portion (e.g., such as a line) of MR data for the second MR data set. The first and second shots may be repeated until filled first and second MR data sets Creation of a difference image based on the first and second MR data sets may then proceed as described above with respect to technique 70 or technique 90. That is, based on the acquired first and second MR data sets, the difference image may be created in either the image domain or in the complex domain.

A technical contribution for the disclosed method and apparatus is that it provides for a computer implemented system and method for enhanced contrast MR imaging.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, in accordance with one embodiment of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus further includes a computer programmed to perform a first scan of an imaging object based on a first fast spin echo (FSE) scan sequence comprising a first series of RF pulses having a first flip angle sequence to acquire a first MR data set and perform a second scan of the imaging object based on a second FSE scan sequence comprising a second series of RF pulses having a second flip angle sequence, wherein the second flip angle sequence is different from the first flip angle sequence to acquire a second MR data set. The computer is further programmed to generate a difference image based on the first and second MR data sets.

In accordance with another embodiment of the invention, a method of magnetic resonance (MR) imaging includes scanning an imaging object based on a first fast spin echo (FSE) scan sequence and reconstructing a first image from the first MR data set. The first FSE scan sequence includes a first series of RF pulses having a first flip angle pattern to acquire a first MR data set. The method also includes scanning the imaging object based on a second FSE scan sequence and reconstructing a second image from the second MR data set. The second FSE scan sequence includes a second series of RF pulses having a second flip angle pattern to acquire a second MR data set, wherein the second flip angle pattern is different from the first flip angle pattern. The method further includes creating a difference image based on the first and second images.

In accordance with yet another embodiment of the invention, a non-transitory computer readable medium having thereon a computer program comprising instructions, which, when executed by a computer, cause the computer to prescribe a first fast spin echo (FSE) scan sequence including a first series of RF pulses having a first flip angle sequence and to scan an imaging object based on the first FSE scan sequence to acquire a first MR data set. The instructions also cause the computer to prescribe a second FSE scan sequence including a second series of RF pulses having a second flip angle sequence and to scan the imaging object based on the second FSE scan sequence to acquire a second MR data set. The second flip angle sequence is different from the first flip angle sequence. In addition, the instructions cause the computer to reconstruct a first image and a second image based on the first and second MR data sets, respectively and to create a difference image based on the first and second images.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance (MRI) apparatus comprising:
an MRI system having a plurality of gradient coils positioned about a bore of a magnet, and an RF transceiver system and an RF switch controlled by a pulse module to transmit RF signals to an RF coil assembly to acquire MR images; and
a computer programmed to:
perform a first scan of an imaging object based on a first fast spin echo (FSE) scan sequence comprising a first series of RF pulses having a first flip angle sequence to acquire a first MR data set;
perform a second scan of the imaging object based on a second FSE scan sequence comprising a second series of RF pulses having a second flip angle sequence, wherein the second flip angle sequence is different from the first flip angle sequence to acquire a second MR data set; and
generate a difference image based on the first and second MR data sets.

2. The MRI apparatus of claim 1 wherein the computer is further programmed to prescribe the first and second FSE scan sequences.

3. The MRI apparatus of claim 2 wherein the computer, in being programmed to prescribe the second FSE scan sequence, is programmed to prescribe a quantity of the second series of RF pulses to have lower flip angles than flip angles of a corresponding quantity of the first series of RF pulses of the first FSE scan sequence.

4. The MRI apparatus of claim 3 wherein the computer is further programmed to generate a difference data set based on a subtraction of MR data of the second MR data set from MR data of the first MR data set; and
wherein the computer, in being programmed to generate the difference image, is programmed to generate the difference image based on the difference data set.

5. The MRI apparatus of claim 3 wherein the computer is further programmed to:
reconstruct a first image based on the first MR data set; and
reconstruct a second image based on the second MR data set.

6. The MRI apparatus of claim 5 wherein the computer, in being programmed to generate the difference image, is programmed to generate the difference image based on a subtraction of a magnitude of image data of the second image from a magnitude of image data of the first image.

7. The MRI apparatus of claim 3 wherein the quantity of the second series of RF pulses are refocusing RF pulses.

8. The MRI apparatus of claim 3 wherein the computer, in being programmed to prescribe the quantity of the second series of RF pulses, is programmed to prescribe the quantity of the second series of RF pulses to have flip angles less than 150 degrees.

9. The MRI apparatus of claim 2 wherein the computer, in being programmed to prescribe the first and second SE scan sequences, is programmed to prescribe first and second 3D FSE scan sequences.

10. The MRI apparatus of claim 2 wherein the computer, in being programmed to prescribe the first and second SE scan sequences, is programmed to prescribe first and second 2D FSE scan sequences.

11. The MRI apparatus of claim 1 wherein the computer, in being programmed to perform the first scan, is programmed to perform the first scan during a diastolic cardiac phase.

12. The MRI apparatus of claim 11 wherein the computer, in being programmed to perform the second scan, is programmed to perform the second scan during a systolic cardiac phase.

13. A method of magnetic resonance (MR) imaging comprising:
scanning an imaging object based on a first fast spin echo (FSE) scan sequence, the first FSE scan sequence comprising a first series of RF pulses having a first flip angle pattern to acquire a first MR data set;
reconstructing a first image from the first MR data set;
scanning the imaging object based on a second FSE scan sequence, the second FSE scan sequence comprising a second series of RF pulses having a second flip angle pattern to acquire a second MR data set, wherein the second flip angle pattern is different from the first flip angle pattern;
reconstructing a second image from the second MR data set; and
creating a difference image based on the first and second images.

14. The method of claim 13 further comprising prescribing a first plurality of the second series of RF pulses to have lower flip angles than corresponding RF pulses of the first series of RF pulses.

15. The method of claim 14 further comprising prescribing a first plurality of the first series of RF pulses to have flip angles set to 180 degrees.

16. The method of claim 14 wherein creating the difference image comprises subtracting image data from the second image from image data of the first image.

17. The method of claim 13 wherein scanning the imaging object based on the first FSE scan sequence comprises scanning the imaging object based on a 3D FSE scan sequence; and
wherein scanning the imaging object based on the second FSE scan sequence comprises scanning the imaging object based on a 3D FSE scan sequence.

18. The method of claim 13 wherein scanning the imaging object based on the first FSE scan sequence comprises scanning the imaging object during a diastolic cardiac phase; and
wherein scanning the imaging object based on the second FSE scan sequence comprises scanning the imaging object during a systolic cardiac phase.

19. A non-transitory computer readable medium having thereon a computer program comprising instructions, which, when executed by a computer, cause the computer to:
- prescribe a first fast spin echo (FSE) scan sequence comprising a first series of RF pulses having a first flip angle sequence;
- scan an imaging object based on the first FSE scan sequence to acquire a first MR data set;
- prescribe a second FSE scan sequence comprising a second series of RF pulses having a second flip angle sequence, wherein the second flip angle sequence is different from the first flip angle sequence;
- scan the imaging object based on the second FSE scan sequence to acquire a second MR data set;
- reconstruct a first image and a second image based on the first and second MR data sets, respectively; and
- create a difference image based on the first and second images.

20. The computer readable storage medium of claim 19 wherein the instructions further cause the computer to scan the imaging object based on the first FSE scan sequence during a diastolic cardiac phase and to scan the imaging object based on the second FSE scan sequence during a systolic cardiac phase.

21. The computer readable storage medium of claim 19 wherein the instructions that cause the computer to create the difference image cause the computer to subtract image data of the second image from image data of the first image.

22. The computer readable storage medium of claim 19 wherein the instructions that cause the computer to prescribe the first FSE scan sequence cause the computer to prescribe flip angles for RF refocusing pulses of the first FSE scan sequence occurring prior to an echo time (TE) to 180 degrees; and
- wherein the instructions that cause the computer to prescribe the second FSE scan sequence cause the computer to prescribe flip angles for RF refocusing pulses of the second FSE scan sequence occurring prior to an echo time (TE) to less than 180 degrees.

23. The computer readable storage medium of claim 19 wherein the instructions that cause the computer to prescribe the second FSE scan sequence cause the computer to prescribe a first plurality of the second series of RF pulses to have lower flip angles than corresponding RF pulses of the first series of RF pulses.

\* \* \* \* \*